United States Patent
Silvano de Sousa

(10) Patent No.: US 11,076,480 B2
(45) Date of Patent: Jul. 27, 2021

(54) COMPONENT CARRIER WITH EMBEDDED FILAMENT

(71) Applicant: AT&S Austria Technologie & Systemtechnik Aktiengesellschaft, Leoben (AT)

(72) Inventor: Jonathan Silvano de Sousa, Vienna (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/740,928

(22) Filed: Jan. 13, 2020

(65) Prior Publication Data

US 2020/0245453 A1 Jul. 30, 2020

(30) Foreign Application Priority Data

Jan. 29, 2019 (EP) ..................... 19154098

(51) Int. Cl.
*H05K 1/02* (2006.01)
*H05K 3/46* (2006.01)

(52) U.S. Cl.
CPC ......... *H05K 1/0272* (2013.01); *H05K 1/0203* (2013.01); *H05K 1/0243* (2013.01); *H05K 3/4644* (2013.01); *H05K 3/4697* (2013.01); *H05K 2201/10151* (2013.01)

(58) Field of Classification Search
CPC .. H05K 1/0203; H05K 1/0207; H05K 1/0204; H05K 1/0206; H05K 1/0209; H05K 1/021; H05K 1/0212; H05K 3/4697
See application file for complete search history.

(56) References Cited

U.S. PATENT DOCUMENTS

| | | | |
|---|---|---|---|
| 5,575,872 A | 11/1996 | Tsukada et al. | |
| 7,494,557 B1 | 2/2009 | Peterson | |
| 2003/0024120 A1 | 2/2003 | Adams et al. | |
| 2010/0163297 A1* | 7/2010 | Kajihara | H05K 3/427 174/264 |
| 2013/0319749 A1* | 12/2013 | Ohashi | H05K 3/0032 174/262 |
| 2015/0237738 A1 | 8/2015 | Wölfel | |
| 2016/0007504 A1* | 1/2016 | Wu | H05K 1/0203 361/700 |

FOREIGN PATENT DOCUMENTS

| | | |
|---|---|---|
| EP | 0352943 A2 | 1/1990 |
| EP | 1738820 A1 | 1/2007 |
| WO | 2004108285 A1 | 12/2004 |

* cited by examiner

*Primary Examiner* — Jeremy C Norris
(74) *Attorney, Agent, or Firm* — Robert A. Blaha; Smith Tempel Blaha LLC

(57) ABSTRACT

A method of manufacturing a component carrier. The method includes forming a stack having at least one electrically insulating layer structure and/or at least one electrically conductive layer structure, and embedding a filament in the stack.

11 Claims, 6 Drawing Sheets

COMPONENT CARRIER WITH EMBEDDED FILAMENT

CROSS-REFERENCE TO RELATED APPLICATION

This application claims the benefit of the filing date of the EP Patent Application 19154098.8 filed Jan. 29, 2019, the disclosure of which is hereby incorporated herein by reference.

TECHNICAL FIELD

Embodiments of the invention generally relate to a method of manufacturing a component carrier and to component carriers.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

SUMMARY

There may be a need to extend the functionality of a component carrier.

According to an exemplary embodiment of the invention, a method of manufacturing a component carrier is provided, wherein the method comprises forming a stack comprising at least one electrically insulating layer structure and/or at least one electrically conductive layer structure, and embedding a filament in the stack.

According to another exemplary embodiment of the invention, a component carrier is provided which comprises a stack comprising at least one electrically insulating layer structure and/or at least one electrically conductive layer structure, and a filament embedded in the stack.

According to still another exemplary embodiment of the invention, a component carrier is provided which comprises a stack comprising at least one electrically insulating layer structure and/or at least one electrically conductive layer structure, and a (in particular hollow) channel with constant cross-section in the stack (in particular with constant cross section in terms of shape and dimension along the entire extension of the channel in the stack), wherein at least part of a trajectory (i.e. a path along which the channel extends within the stack) of the channel extends within a plane of (in particular lies within a two-dimensional area being coplanar with) the layer structures.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "filament" may particularly denote any wire, fiber, thread, string or yarn or any other oblong structure which is sufficiently flexible to be bendable (in particular elastically or plastically) for forming any desired shape. A filament may also be denoted as a very thin rope. Such a filament may be an oblong structure, for instance an essentially cylindrical structure, having a very small diameter (for in-stance of less than 1 mm, particularly less than 500 µm) and a very long length (for instance longer than 5 mm, particularly longer than 5 cm). Thus, a filament may be a small dimensioned fiber having a large aspect ratio, for instance larger than 100. For instance, filaments used for embedding in a component carrier may be flat filaments (which may have an oval or rectangular cross-section, for instance to form a ribbon) or may have a circular or square cross-section.

According to an exemplary embodiment of the invention, a component carrier is provided in which one or more filaments are embedded. The filament may either remain part of the readily manufactured component carrier or may be removed after its embedding in the stack so as to leave a hollow channel in an interior of the component carrier at a position where the embedded filament had been located. By taking this measure, it may be possible with simple means to improve the functionality of the obtained component carrier. The latter may include an embedded filament which may serve for example as an electrically conductive, optically conductive and/or thermally conductive structure which can be embedded with very low effort. It is however also possible that the embedded filament is subsequently removed from the rest of the component carrier so that a hollow channel is obtained within the stack which can be used for example for cooling purposes (in particular for guiding cooling fluid through the component carrier), as access for acoustic waves (for instance in the event of an embedded micro-phone or loudspeaker), or which may be filled with appropriate material (such as thermally conductive and/or electrically conductive material) to promote or adjust a corresponding function of the component carrier. In view of the small dimensions of a filament in the two dimensions being orthogonal to the main extension direction of the filament, embedding such a filament in component carrier material may be very simple and may be possible even without formation of a cavity.

According to an exemplary embodiment of the invention, one or more cavities may be created in the plane of a component carrier (such as a printed circuit board, PCB) in any format, preferably but not necessarily without using any cutting technique, but merely by embedding a filament in the component carrier material and subsequently removing at least part of the filament from the component carrier. The possibility of building channels and cavities in the component carrier in any possible format is highly advantageous. It is also advantageous that such a channel (configured as a negative or inverse form to the embedded filament) can be formed at any production stage of the component carrier. The described concept is also compatible with any two-dimensional or three-dimensional geometry of the cavity or filament. The filament or string can be optionally coated, for instance by an electrically conductive material (for example copper), to leave an electrically conductive wall in the cavity when pulling the filament out of the component carrier. As other possible materials of the component carrier, is also possible to use a plastic material such as nylon or a metal such as steel, i.e. material allowing to pull out at least a core of the filament without tearing or leaving undesired rests of the filament behind, i.e. an interior of the component carrier. In other words, the filament may be configured so that, when pulled out of the component carrier, the filament or string does not leave any rests in the cavity. The cavity can be formed in the component carrier at any production stage, even after assembly. One single filament or string can produce the cavity for many different cards or component carriers of a panel. Another possibility is to use extremely fine strings to produce microscopic channels in the component carrier. For instance, it may be possible to apply electric contacts to the cavity and to use it in applications such as gas sensors, microphones, antennas, etc. It should however be said that, in other embodiments, the filament may remain permanently inside of the component carrier, i.e. may form part of the readily finished component carrier.

In the following, further exemplary embodiments of the method and the component carriers will be explained.

Exemplary applications of exemplary embodiments of the invention are active cooling via one or more micro-channels, the formation of an acoustic channel, medical applications implementing microfluidic channels, sensor applications, RF (radio frequency) applications (which may also implement an air gap in an interior of the component carrier), optical applications (where an optical signal may propagate through an air gap maintained after removing the filament from the component carrier, or a waveguide embedded in the component carrier in the form of a filament. Exemplary embodiments of the invention may enable active cooling directly in the component carrier via the construction of one or more cooling channels through which a coolant (such as water or air) can flow to remove heat (for instance generated by an embedded component during operation) from an interior of the component carrier. The filament concept can also be used for high-frequency antennas to form air channels for wave propagations. Exemplary embodiments of the invention may also allow the construction of sensor platforms in which the embedded component or a hollow channel formed by subsequently removing an embedded filament from a component carrier may contribute to the sensor function.

For instance, a material of the filament may be capable of withstanding higher temperatures than applied during processing or manufacturing (in particularly pressing or laminating).

In an embodiment, the method comprises removing the embedded filament—partially or entirely—out of the stack. By taking this measure, an embedded cavity can be formed in the stack with low effort.

In an embodiment, at least one material of the filament and a material of at least one of the at least one electrically insulating layer structure and/or of at least one of the at least one electrically conductive layer structure is identical. For instance, when the filament is removed partially out of the stack, the remaining filament material of the component carrier may be the same as a material of an electrically conductive layer structure and/or an electrically insulating layer structure of the stack.

In an embodiment, the method comprises removing the filament from the stack by pulling the filament out of the stack. For this purpose, an end portion of the filament should extend out of the component carrier material after the embedding, so that a pulling end remains accessible. It is alternatively also possible to remove the filament by decomposing the filament in the stack, for instance by selective (with regard to material of the stack) etching or burning.

In an embodiment, the method comprises embedding the filament in the stack so as to form a two-dimensional trajectory within a plane perpendicular to a stacking direction of the layer structures of the stack. Thus, the filament may extend along a path so as to lie within a two-dimensional area being coplanar with the layer structures of the stack. In particular when the filament is made of a flexible, bendable or elastic material, it is possible that the filament is placed in a two-dimensionally bent shape in an interior of the component carrier in the plane corresponding to the stacked layer structures of the component carrier.

In an embodiment, the method comprises embedding the filament in the stack so that the filament is arranged along a three-dimensional trajectory having at least a section within and at least one other section perpendicular to a stacking plane of the layer structures of the stack. Such an embodiment is shown, for instance, in FIG. 19. It is also possible that the embedded filament is not only arranged along a path within a plane arranged vertical to the stacking direction of the layer structures, but that the trajectory of the filament has contributions within the mentioned plane and perpendicular to the mentioned plane. In the latter embodiment, a three-dimensionally curved filament embedded in the component carrier, or (for instance after pulling the filament out of the component carrier) a three-dimensionally curved cavity can be formed.

In an embodiment, the method comprises covering at least part of an interior wall of the stack, delimited by a channel remaining after removing the filament, by a coating. For instance, at least a part of the channel may be lined with a coating, in particular a coating selected from the group consisting of an electrically conductive coating, a thermally conductive coating, a reflective coating, and a waterproof coating. Such a lining of the cavity wall can be accomplished by coating the filament, prior to inserting the same into the stack, with a material which remains in the cavity after having pulled a core of the filament out of the component carrier. For instance, such a coating may be a solid hollow tube (for instance made of copper material when the coating shall be electrically conductive and thermally conductive) surrounding the core of the filament with low mutual adhesion. It is also possible that the coating is a paste or the like applied to the filament and configured for remaining adhered to the component carrier material when the core of the filament is removed out of the component carrier. A release layer of the filament between the core and the coating may promote separation of the coating from the core, when the release layer is made of a poorly adhesive material (relative to the core and the coating).

In an embodiment, the method comprises partially or completely filling a channel, remaining in the stack after removing the filament, with electrically conductive material. This can be accomplished, for instance, by pressing a—for instance paste like—electrically conductive material (for instance copper paste) into the cavity (for instance using a syringe or the like). It is also possible that the filament itself is made of an electrically conductive material in remains permanently part of the component carrier. By taking this measure, it may for instance be possible to form an antenna structure and/or an inductor structure integrated in the component carrier.

Additionally or alternatively, the method may comprise filling a channel, remaining in the stack after removing the filament, partially or completely with a highly thermally conductive material (for instance having a value of the thermal conductivity of at least 50 W/mK) to thereby form a heat removal structure for removing heat generated during operation of the component carrier. This can be accomplished, for instance, by pressing a—for instance paste like—thermally conductive material (for instance copper paste) into the cavity (for instance using a syringe or the like). It is also possible that the filament itself is made of a thermally conductive material.

In an embodiment, the method comprises guiding a cooling fluid (such as a cooling liquid, for instance water, or a cooling gas, for instance air) through a channel remaining in the stack after removing the filament for removing heat generated during operation of the component carrier. This can be highly advantageous in particular when a component (such as a semiconductor chip) is embedded in the component carrier and generates considerable amount of heat during operation. The component can then be surrounded for instance by the filament already during embedding so that the heat removal function is provided spatially very close to the component when the filament has been removed and the cooling fluid is guided through the channel.

In an embodiment, the method comprises configuring a channel remaining in the stack after removing the filament for guiding one of acoustic waves (such as sound), electromagnetic high-frequency waves (for instance microwaves), and visible electromagnetic waves (i.e. visible light) along the channel. For instance, the interior end of the channel may then be connected with a movable membrane of an acoustic element (such as a microphone or a loudspeaker). Also, high-frequency components (for instance for micro-wave applications) may be connected to an acoustic hollow space which may be formed with the filament-based channel. Also, light may propagate through the channel, for instance in terms of an optoelectronic application.

In an embodiment, a surface of the filament in contact with the stack is non-adhesive with regard to the material of the stack. For instance, the filament may comprise a core covered with a coating made of a material having poorly adhesive properties with regard to surrounding material of the stack. For instance, this may be accomplished by forming a surface of the filament of a non-adhesive material such as a waxy material. It is also possible that the entire filament consists of material having poor adhesion properties with regard to surrounding material of the stack. For instance, this may be accomplished by manufacturing the filament of a non-adhesive material such as polytetrafluoroethylene. By taking this measure, it may be simplified to remove the filament out of the component carrier without the risk of tearing.

In an embodiment, the method comprises promoting removal of the filament out of the stack by at least one of the group consisting of ultrasonic vibrations, and temperature increase. Providing ultrasonic waves in the surrounding of the component carrier with embedded filament and/or heating the mentioned arrangement to an elevated temperature has turned out to promote the removal of the filament out of the component carrier. Also, by taking this measure, the risk of tearing of the filament during pulling it out from the component carrier may be strongly reduced.

In an embodiment, the method comprises forming at least one recess in at least one of the layer structures of the stack, placing the filament in the recess, and connecting the layer structures, in particular by lamination, to thereby embed the filament in the stack. When a recess is formed in the component carrier material prior to inserting the filaments therein, the trajectory of the filament may be defined with particularly high precision. Forming a cavity in the stack prior to embedding the filament therein may also be advantageous when the filament has a relatively large cross-section.

In another embodiment, the method comprises embedding the filament between opposing planar surfaces of two adjacent layer structures of the stack, in particular without previously forming a cavity in any of these two layer structures. In such a preferred embodiment, there is no need of forming a cavity in a layer structure in which the filament is embedded by lamination. Thus, the mentioned embodiment allows manufacturing a component carrier with an embedded filament or with an interior hollow channel after having removed an embedded filament out of the component carrier with particularly low effort. In particular when the filament has a relatively small cross-section, such a manufacture is easily possible.

In an embodiment, the method comprises embedding a filament in the stack, which filament comprises a core covered with a release layer being covered, in turn, by a coating. According to the method, it may then be possible to remove the core (optionally with the release layer) out of the stack while keeping the coating inside of the stack for lining a remaining channel in the stack. In such an embodiment, the filament comprises three distinguishable layers in a cross-section. In an interior, a core made of a material (such as steel) with high mechanical integrity and strength is provided allowing to pull out the filament without the risk of breakage. An intermediate layer may be made of release material (such as a waxy material) allowing for a mutual low frictional sliding of the interior core relative to the exterior sleeve. The exterior sleeve may be made of a material having a poor adhesion with regard to surrounding component carrier material and may include a functionality (for instance an electric, an optical, and/or a thermal function). For instance, this exterior sleeve may be made of copper (for instance to provide an electrically conductive and/or thermally conductive connection between an interior and exterior of the component carrier) or an optically highly reflective material (promoting a low loss propagation of electromagnetic radiation such as light between an interior and an exterior of the component carrier).

In an embodiment, the filament is configured so as to be removable from the stack. Removal of the filament may be accomplished for example by pulling the filament out of the stack. The material of the filament should then have a sufficient mechanical strength so as to be reliably prevented from tearing during the pulling operation. As an alternative method of removing the filament out of an interior of the component carrier, it is possible to selectively etch the material of the filament with regard to material of the component carrier stack. In yet another embodiment, it is possible to remove the material of the filament by selectively burning away the filament at a temperature below the burning temperature of the material of the stack. In the latter mentioned embodiments, the filament may be configured as a sacrificial structure.

In an embodiment, a cross-section of the filament has a shape of the group consisting of a round shape (in particular a circular shape or an elliptic shape) and a polygonal shape (in particular a triangular shape, a rectangular shape, a cross shape or a star shape). Correspondingly, a cross-section of a channel obtained by removing the filament from the component carrier may have the same shape as the assigned filament. Substantially any cross-sectional shape of the filament and of the channel is possible. However, in particular when the filament shall be removed from the component carrier by pulling, it may be advantageous that the filament is configured so as to have a constant cross-section at least in a portion of the filament being embedded in the interior of the component carrier.

In an embodiment, the component carrier comprises an embedded sensor component in direct contact with the filament so that the sensor component is exposable towards an environment of the component carrier upon removing the filament out of the stack. Correspondingly, the embedded sensor component may be in direct contact with a channel (after having removed the filament out of the stack) so that the sensor component is exposed towards an environment of the component carrier via the channel. Examples for sensors which can be implemented according to exemplary embodiments of the invention are gas sensors, liquid sensors, humidity sensors, chemical sensors, acoustic sensors, etc. It is also possible that the filament forms part of a sensor.

In an embodiment, a thickness of the filament (and correspondingly of the channel) is in a range between 100 μm and 2 mm. For instance, the thickness of the filament or the channel may be 500 μm. Additionally or alternatively, a length of the filament (and correspondingly of the channel) in an interior of the component carrier may be in a range between 0.5 cm and 10 m. However, other dimensions are of course possible.

In an embodiment, the filament is configured as a co-axial cable. In the context of this document, the term "co-axial cable" or "coax cable" may be any lengthy physical structure comprising an inner conductor, an outer conductor surrounding the inner conductor, and an insulating material in between. The insulating material may comprise a dielectric material. As long as an electric insulation between the inner conductor and the outer conductor is given, the insulating material may even be air. In accordance with the basic physical principle of a coax cable the outer conductor surrounds at least partially, preferably completely, the inner conductor. By this way high frequency signals can propagate within the coax cable without having a high attenuation and/or without emitting unwanted electromagnetic radiation.

In an embodiment, the filament is configured as a heat pipe. In the context of the present application, the term "heat pipe" may particularly denote a heat-transfer structure that combines the principles of both thermal conductivity and phase transition of a fluid in an interior of the heat pipe to efficiently manage the transfer of heat between two solid interfaces. At a hot interface of a shell of the heat pipe the fluid in a liquid phase in contact with a thermally conductive solid surface turns into a gas/vapor by absorbing heat from that surface. The gas/vapor then travels, guided by a guiding structure, along the heat pipe to a cold interface of the shell and condenses back into a liquid, thereby releasing the latent heat or phase transition heat. The liquid then returns, guided by the guiding structure, to the hot interface through one or more mechanisms such as capillary action, centrifugal force, gravity, or the like, and the cycle repeats. However, heat pipes may also use another heat transporting medium than a fluid, for instance a solid such as wax.

In an embodiment, the filament, together with a magnetic core surrounded by the electrically conductive filament, is configured as an inductor. In the context of the present application, the term "inductor" may particularly denote a passive (in particular two-terminal, for instance inductance, or four-terminal, for instance transformer) electrical component that is capable of storing energy in a magnetic field when electric current flows through the inductor. An inductor may comprise an electrically conductive wiring (which may be formed by the filament) wound into a coil shape around a magnetic core (such as a ferrite body).

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

A substrate or interposer may comprise or consist of at least a layer of glass, silicon, ceramic and/or organic material (like resin). A substrate or interposer may also comprise a photo-imageable or dry-etchable organic material like epoxy-based Build-Up films or polymer compounds like Polyimide, Polybenzoxazole, or Benzocyclobutene.

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, glass-spheres, multi-layer glass, glass-like materials), prepreg material, photo-imageable dielectric material, polyimide, polyamide, liquid crystal polymer (LCP), epoxy-based Build-Up Film, polytetrafluoroethylene (Teflon), a ceramic, and a metal oxide. Teflon® is a registered mark of The Chemours Company FC, LLC of Wilmington, Del., U.S.A. Reinforcing materials such as webs, fibers or spheres, for example made of glass (multilayer glass) may be used as well. Although prepreg, FR4, or epoxy-based Build-Up Film or photo-imageable dielectrics are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier comprises a component embedded in the stack.

In one embodiment, the filament may be thermally coupled with the component so as to remove heat generated during operation of the component carrier away from the component. For instance, the component may be a semiconductor chip generating significant amount of heat in an interior of the component carrier during operation. When arranging a heat removing filament (for instance wound around the component) close to the component, the filament (or a hollow channel defined by the later removed filament and serving as a cooling channel through which a cooling fluid may be guided) may remove heat out of the component carrier.

Additionally or alternatively, the filament may be electrically coupled with the component so as to transfer at least one of electric signals and electric energy between the component and an exterior of the component carrier. An electrically conductive filament may therefore serve for signal transport and/or electric power supply purposes. When the filament is made of significant size and is made of an appropriate material (such as copper or aluminum) having both electrically conductive and highly thermally conductive properties, heat removal and electrically conductive properties of the filament may be advantageously combined.

In another embodiment, the filament (or a hollow channel formed based on the filament) may be connected to an embedded sensor component. Thus, the filament or the hollow channel may contribute to a sensor function of the component carrier, together with the embedded sensor component.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a further component carrier (for example a printed circuit board, a substrate, or an interposer) in a board-in-board configuration. The component may be surface mounted on the component carrier and/or may be embedded in an interior thereof. Moreover, also other components, in particular those which generate and emit electro-magnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
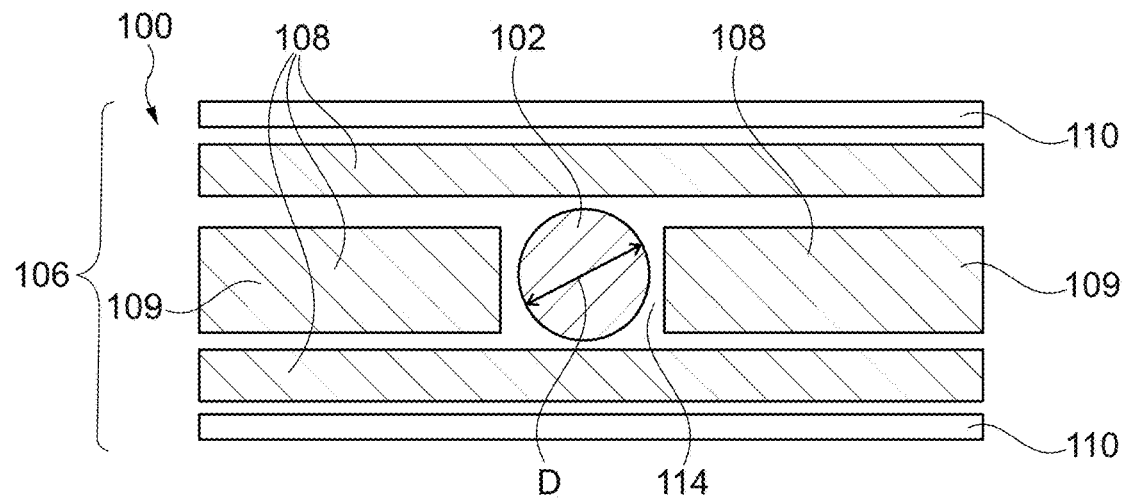
FIG. 1 illustrates a cross-sectional view of a pre-form of a component carrier having a filament which is embedded in a cavity according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, one or more filaments are embedded in a stack of component carrier material. Subsequently removing the filament(s) by pulling it/them out from the stack may allow the formation of one or more channels or cavities in the component carrier (in particular a printed circuit board, PCB). These channels or cavities can be used for many different applications such as sensors, thermal management, antennas, etc. It is however alternatively also possible to maintain the filament permanently within the component carrier, so that the embedded filament may functionally contribute to the component carrier function. For instance, such a filament may be used for contacting an embedded component, as an embedded optoelectronic light guide, etc.

By the described manufacturing architecture, it may be possible to form one or more tunnels or channels in a PCB structure in a similar way as an earthworm forms cavities in the earth. According to an exemplary embodiment of the invention, a filament or string may be used for this construction. For example, the string or filament can be made of materials such as polytetrafluoroethylene, metals, nylon, wires, etc. If the filament or string material is selected to have good adhesion to the surrounding component carrier material (in particular PCB epoxy material), then this core material of the filament can be advantageously coated with a further material (which may be denoted as release material) which does not have good or which does not have any adhesion to the epoxy material (for instance polytetrafluoroethylene, graphite (such as DLC, diamond like carbon), wax, silicon, etc.). Descriptively speaking, the filament or string may then work as a temporary or permanently embedded structure in the component carrier. The filament can have substantially any cross-sectional format (for instance triangular, circular, quadrangular, or any other).

For instance, after a lamination process (which may be accomplished by the supply of mechanical pressure and/or heat), the string can be pulled out of the component carrier leaving behind its cavity as in the above biomimetic example of the wormhole. For example, in order to make the release process more efficient and reliable, ultrasound vibrations and temperature increase can be applied. This can help to break the binding forces between the release layer and the epoxy material. The release process can be carried out at any time of the production of the component carrier, when the component carrier is readily manufactured or after assembly of one or more components on the component carrier.

The tunnel left behind can be formed to extend in two or three dimensions depending on how the filament or string is placed in the stack up. The tunnel can also be connected to plated through holes and/or laser drilled vias. The filament or string can also be pulled off from holes made on the surface of the component carrier.

In addition, tunnels and/or a cavity formed by the filament or string can be metallized (for instance can have copper added to its walls), for example via a galvanic copper process forming a sealed structure.

In one embodiment, the one or more cavities made in the component carrier may extend straight or linear. Techniques with wax may be applied where the hole is formed in the component carrier. A releasing procedure and the freeing of the cavity can be done at the final stage where the component carriers are already cut out of the production panel format.

Thus, exemplary embodiments of the invention may make it possible to build channels and cavities in the component carrier in any possible format. Advantageously, such a channel can be formed at any production stage of the component carrier. When pulled, the string or filament does not leave any rests in the cavity. To further reduce the effort, one single string or filament can produce the cavity for many different component carriers of a panel.

In an embodiment, the string or filament can be made of extremely resistant material such as nylon. Another possibility is to use extremely fine strings to produce microscopic channels.

Exemplary embodiments may also enable active cooling directly in the component carrier via the construction of one or more channels. In other exemplary embodiments of the invention, the embedding of one or more filaments can also be used for high-frequency antennas by allowing air channels for wave propagations. Other exemplary embodiments of the invention may also allow the construction of sensor platforms in an interior of the component carrier. The filament or a cavity formed using such an embedded filament may contribute to the sensor function.

FIG. 1 illustrates a cross-sectional view of a pre-form of a component carrier 100 having a filament 102 to be embedded in a cavity or recess 114 according to an exemplary embodiment of the invention. The cross-sectional view of FIG. 1 illustrates the pre-form of the component carrier 100 before lamination.

In the shown embodiment, the component carrier 100 is embodied as printed circuit board (PCB). The component carrier 100 according to FIG. 1 comprises a layer stack 106—which is to be connected by lamination—composed of multiple electrically conductive layer structures 110 and multiple electrically insulating layer structures 108.

The electrically conductive layer structures 110 may comprise patterned metal layers (such as plated copper and/or patterned copper foils, etc.) and metallic vertical interconnects (not shown in FIG. 1). The vertical interconnects may be formed, for example, by mechanically drilling and/or laser drilling. Correspondingly formed drill holes may then be at least partially filled with electrically conductive material (for instance copper), for instance by a combination of electroless plating and subsequently galvanic plating. In particular, the vertical interconnects are formed by forming holes by laser drilling and subsequently electrically conducting the holes by copper plating.

The electrically insulating layer structures 108 may comprise laminated layers which may be made of resin (in particular of epoxy resin), optionally additionally comprising reinforcing particles (such as glass fibers or glass spheres). For instance, the electrically insulating layer structures 108 may be made of prepreg or resin-based build-up material. The electrically insulating layer structures 108 also comprise a central base structure 109 with a cavity or recess 114. The base structure 109 may for instance be made of a fully cured dielectric material such as FR4. The layer structures 108, 110 may be connected by lamination to thereby embed the filament 102 in the stack 106. Descriptively speaking, FIG. 1 illustrates a PCB build-up before lamination.

As shown in FIG. 1, the filament 102 (extending in a direction perpendicular to the paper plane of FIG. 1) with a circular cross-section is embedded in the stack 106. The filament 102 may be made of material having poor adhesion properties with regard to surrounding material of the stack 106. For instance, the filament 102 may be made of steel so that the filament 102 is mechanically strong enabling to be subsequently pulled out of the rest of the component carrier 100. In a corresponding embodiment, a cavity shall be formed at the position of the filament 102 by removing the latter from the stack 106. In the shown embodiment, a cross-section of the filament 102 has a circular shape. A thickness or diameter, D, of the filament 102 may be for example 500 μm. A length of the filament 102 in a direction perpendicular to the paper plane of FIG. 1 may be for example 10 cm. Although not shown in FIG. 1, an end of the filament 102 may extend beyond or out of the stack 106 so as to allow pulling out the filament 102 after its embedding out of the stack 106.

As shown in FIG. 1, the filament 102 may be sandwiched between upper and lower continuous planar sheets of the electrically insulating layer structures 108 (for instance made of an uncured material such as prepreg) and may be accommodated in a central through hole of the central base structure 109 (for instance made of a cured material such as FR4). Such a procedure may be advantageous when the filament 102 has a high thickness or diameter D.

Figure 2:
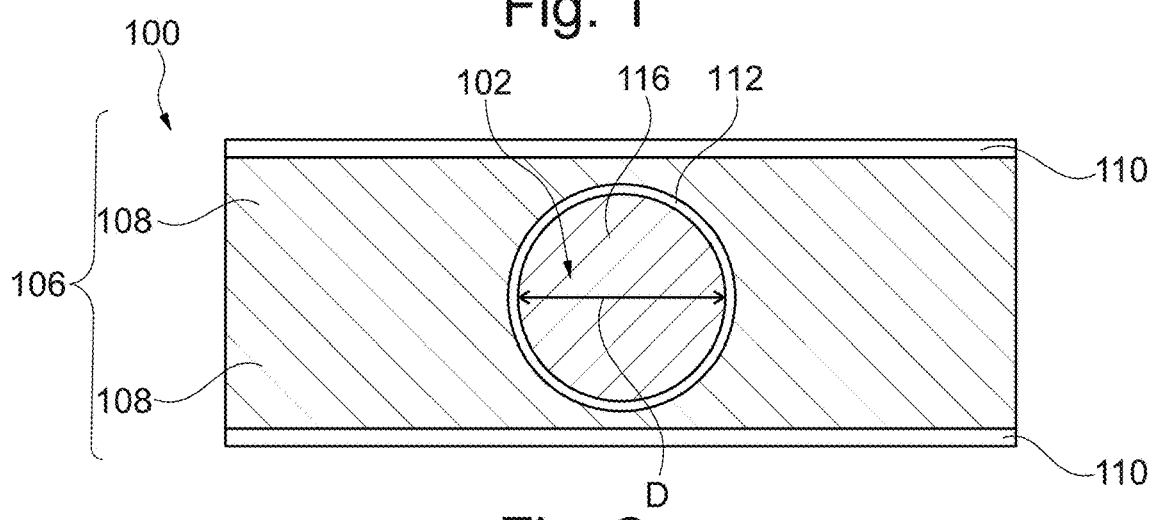
FIG. 2 illustrates a cross-sectional view of a component carrier having an embedded filament according to an exemplary embodiment of the invention.

FIG. 2 illustrates a cross-sectional view of a component carrier 100 having a filament 102 embedded between planar layers 108, 110 according to an exemplary embodiment of the invention.

In the embodiment of FIG. 2, it may be possible to sandwich the filament 102 directly between two opposing planar surfaces (not shown) of two adjacent layer structures 108 (for instance made of an uncured material such as prepreg) of the stack 106 without previously forming a recess 114 in any of these two layer structures 108. In other words, the central base structure 109 shown in FIG. 1 may be omitted according to FIG. 2. Such an approach allows to particularly simplify manufacture of the component carrier 100 without the need of forming through holes prior to embedding the filament 102, and may be particularly appropriate when the filament 102 has a relatively small thickness or diameter D.

In the shown embodiment, the filament 102 comprises a cylindrical core 116 (for instance made of steel) covered with a hollow cylindrical coating 112 made of a material (for instance polytetrafluoroethylene) having poorly adhesive properties with regard to surrounding material of the stack 106. By taking this measure, the filament 102 is properly configured so as to be removable from the stack 106 by pulling the filament 102 out of the stack 106 without the risk of tearing of the core 116. A channel 104 (not shown in FIG. 2, see however FIG. 4) may then be formed in the stack 106. Hence, FIG. 2 shows a PCB build-up after lamination.

In another embodiment, the filament 102 may be directly adjacent to one or both of the layers 110. This may allow to directly remove heat on copper layers, so that the filament 102 may be used for example for water cooling.

Figure 3:
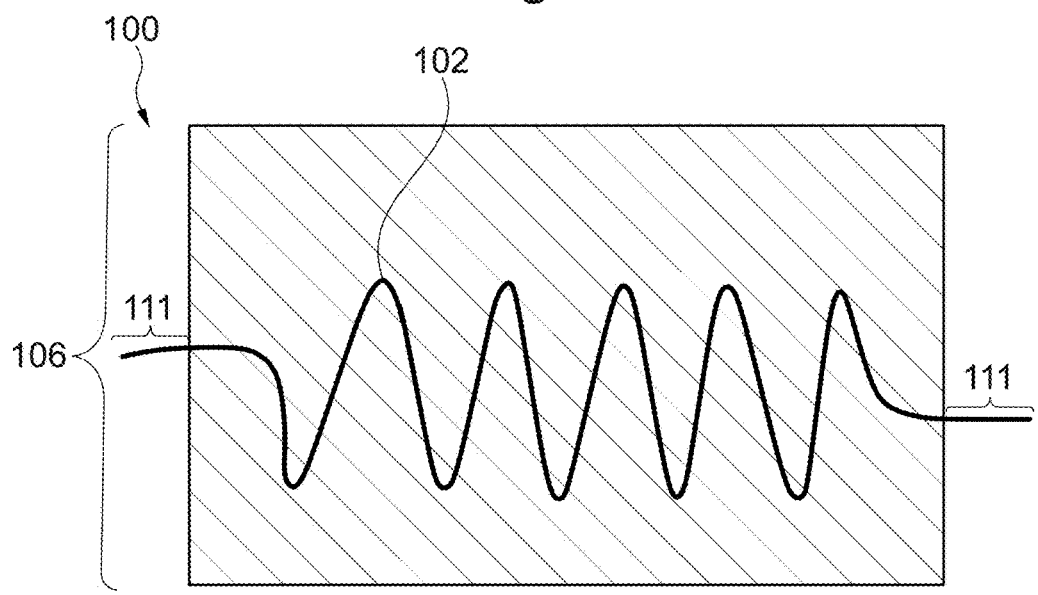
FIG. 3 illustrates a three dimensionally curved filament embedded in a component carrier according to an exemplary embodiment of the invention.

FIG. 3 illustrates a three dimensionally curved filament 102 embedded in a component carrier 100 according to an exemplary embodiment of the invention. According to FIG. 3, the filament 102 has been embedded in the stack 106 so as to form a two-dimensional trajectory within a plane perpendicular to a stacking direction of layer structures 108, 110 of the stack 106. Since ends 111 of the filament 102 extend beyond side walls of the component carrier 100, it is possible to pull (in particular manually or machine supported) the filament 102 out of the component carrier 100 so as to form a correspondingly shaped planar channel 104 (see FIG. 4) in an interior of the component carrier 100.

Figure 4:
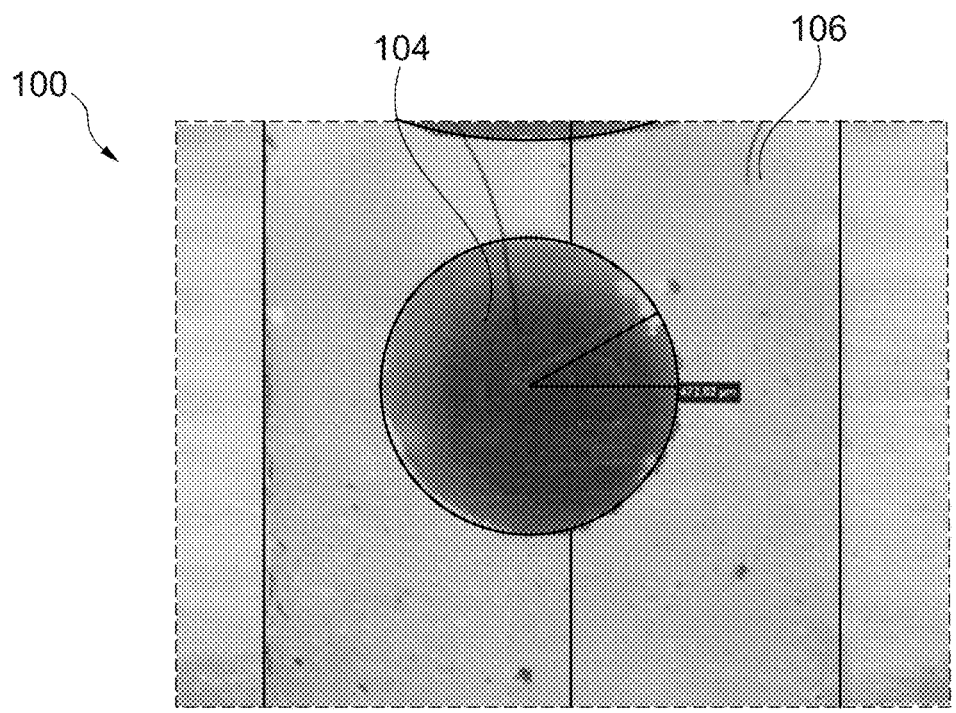
FIG. 4 illustrates an image of a component carrier having a channel formed by embedding and subsequently removing a filament in the component carrier according to an exemplary embodiment of the invention.

FIG. 4 illustrates a cross-sectional image of a component carrier 100 having a channel 104 formed by embedding and subsequently removing a filament 102 (not shown in FIG. 4) in the component carrier 100 according to an exemplary embodiment of the invention.

More precisely, FIG. 4 shows an image of an actually manufactured printed circuit board (PCB) with an approximately 500 μm diameter thick and approximately 4 cm long hollow channel 104. Thus, FIG. 4 shows the picture of a real prototype manufactured in the laboratory. A slot or recess 114 was built in a thick PCB core as base structure 109. A wire for microelectronics purposes coated with silicon spray was placed as a filament 102 in the cavity or recess 114 to build the tunnel. In a subsequent procedure, the slot was filled with epoxy material. The structure was placed in an oven at 180° C. for 90 minutes for curing. After curing, the filament 102 was pulled from the rest of the component carrier 100, and the hollow channel 104 was obtained. If desired or required, removal of the filament 102 out of the stack 106 may be promoted by ultrasonic vibrations and/or temperature increase.

Figure 5:
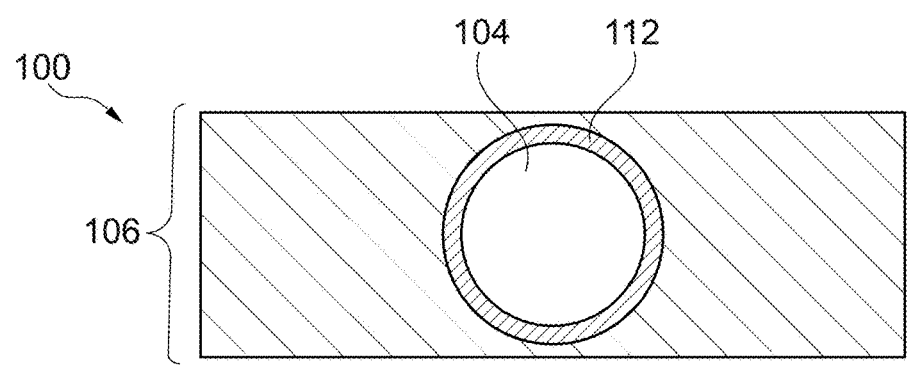
FIG. 5 illustrates a cross-sectional view of a component carrier having a channel lined with a tubular coating according to an exemplary embodiment of the invention.

FIG. 5 illustrates a cross-sectional image of a component carrier 100 having a channel 104 lined with a tubular coating 112 according to an exemplary embodiment of the invention. The channel 104 with the coating 112 is embodied as a copper coated tunnel.

Thus, the shown component carrier 100 has a (in particular hollow) channel 104 with constant circular cross-section in the stack 106. A sidewall of the channel 104 is lined with an electrically conductive and thermally conductive copper coating 112. Descriptively speaking, the coating 112 delimiting channel 104 may form an in-plane plated through hole.

Figure 21:
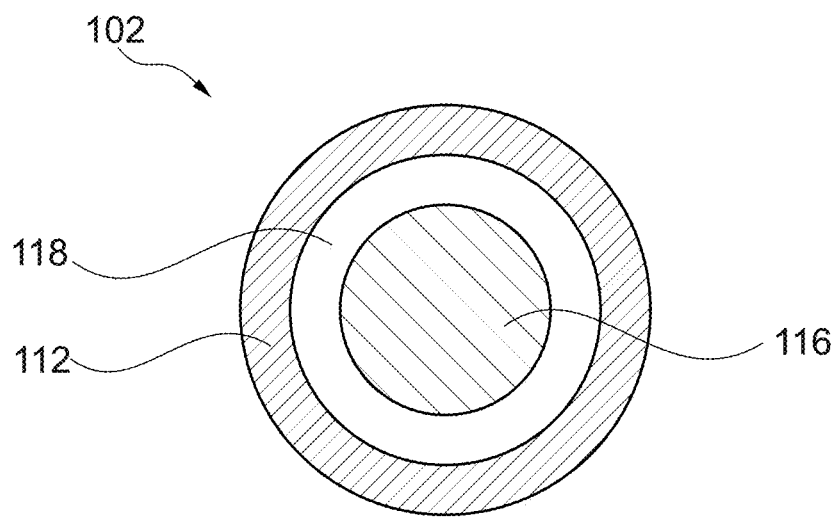
FIG. 21 illustrates a cross-sectional view of a filament according to an exemplary embodiment of the invention.

After embedding a filament 102 with the coating 112 in the stack 106 (in particular using a construction of the filament 102 as shown in FIG. 21 as described below), the component carrier 100 shown in FIG. 5 may be formed by removing a core 116 of the filament 102 from the stack 106 by pulling the core 116 of the filament 102 out of the stack 106. When the core 116 of the filament 102 is removed out of the channel 104, the coating 112 may remain inside the channel 104 and may delimit the channel 104. As an alternative manufacturing method, it may be also possible to remove the entire filament 102 after embedding the same in the stack 106 and to subsequently cover exposed walls of the channel 104 by the copper coating 112.

Figure 6:
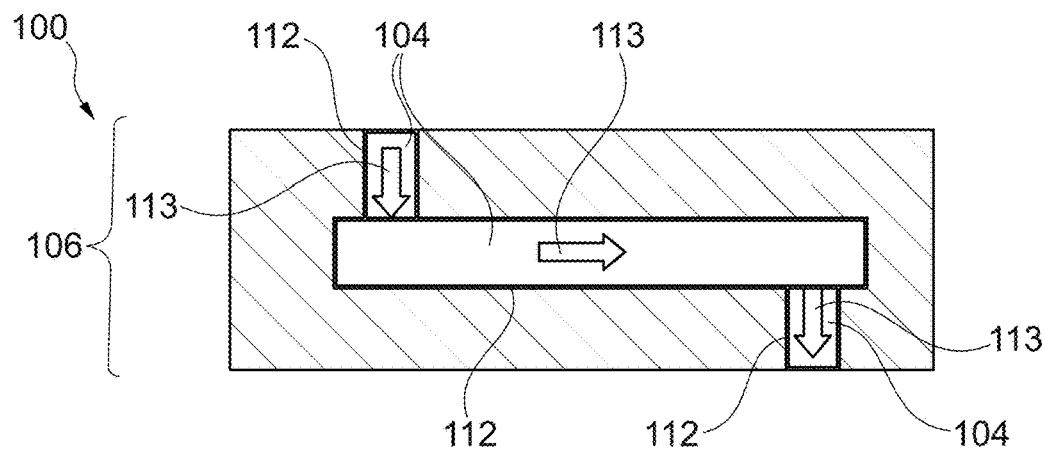
FIG. 6 illustrates a cross-sectional image of a component carrier having a channel lined with a tubular coating and composed of multiple channel sections extending horizontally and vertically through the component carrier according to an exemplary embodiment of the invention.

FIG. 6 illustrates a cross-sectional image of a component carrier 100 having a channel 104 lined with a tubular coating 112 and composed of multiple connected channel sections (see reference numeral 104) extending horizontally and vertically through the component carrier 100 according to an exemplary embodiment of the invention.

FIG. 6 shows an example of ducts for water cooling of the component carrier 100. As indicated by arrows 113, water or any other liquid or gaseous cooling medium may be guided through the channel 104 for removing heat out of an interior of the component carrier 100 during operation.

Figure 7:
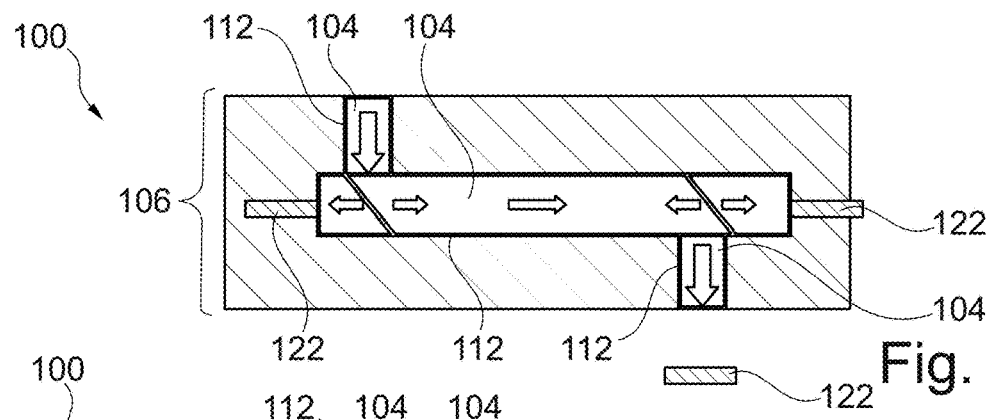
FIG. 7 illustrates a component carrier of the type shown in FIG. 6 and being usable for ducts for high-frequency or acoustic applications.

FIG. 7 illustrates a component carrier 100 of the type shown in FIG. 6 and being usable as ducts for high-frequency or acoustic applications. One or more components 122 may be embedded in the component carrier 100 and/or may be externally connected to the component carrier 100. The components 122 may be for instance sensor components and/or actuator components for applications such as LIFI (light fidelity), WIFI/WLAN (wireless local area network), acoustic applications (for instance for a microphone function or a loudspeaker function), etc. For instance, the channel 104 may be used for the propagation of high-frequency signals, acoustic signals or a resonator function. In particular, the channel 104 formed in the stack 106 by removing the filament 102 may be configured as an acoustic resonator recess.

Figure 8:
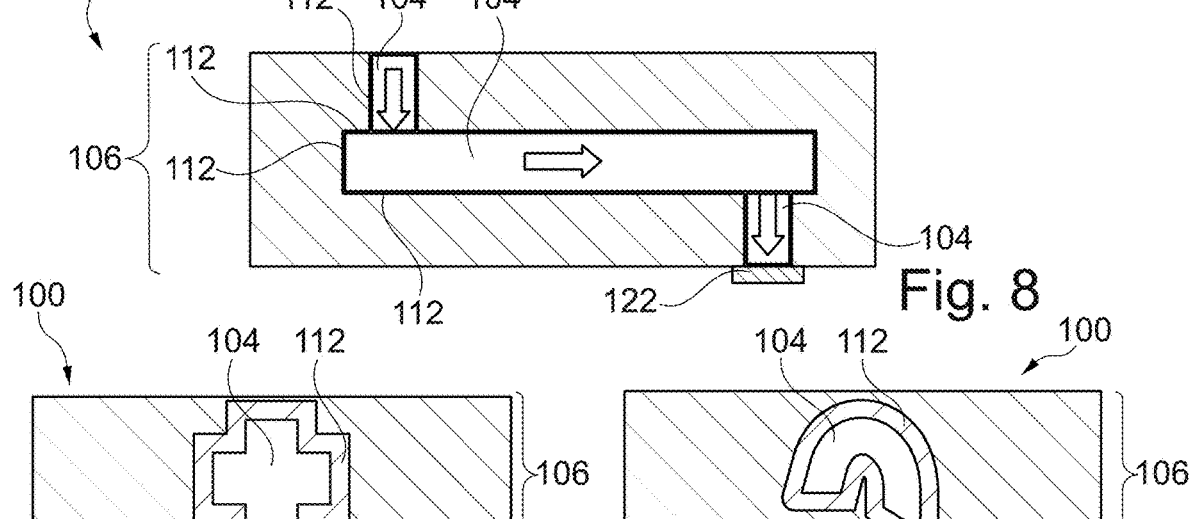
FIG. 8 illustrates a component carrier of the type shown in FIG. 6 and being usable for a gas sensor application.

FIG. 8 illustrates a component carrier 100 of the type shown in FIG. 6 and being usable for a gas sensor application.

An embedded sensor component 122 is provided in direct contact with the channel 104 defined by the meanwhile removed filament 102 so that the sensor component 122 is exposed towards an environment of the component carrier 100 via the channel 104 upon removing the filament 102 out of the stack 106. FIG. 8 relates to the example of a duct (in form of channel 104) for gas sensing by gas sensor component 122.

Figure 9:
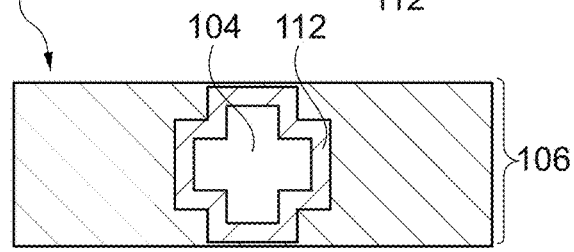
FIG. 9 illustrates a cross-sectional view of a component carrier according to an exemplary embodiment of the invention having a lined channel with plus-shape.
Figure 10:
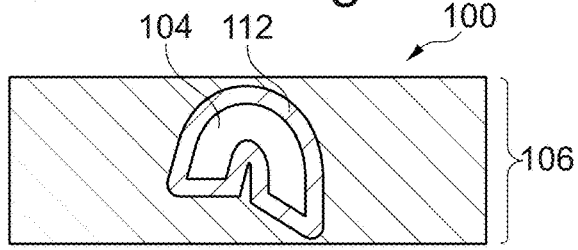
FIG. 10 illustrates a cross-sectional view of a component carrier according to an exemplary embodiment of the invention having a lined channel with arc shape.
Figure 11:
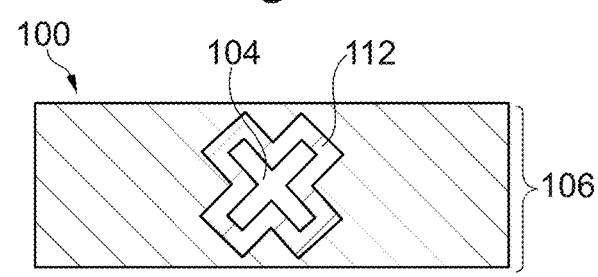
FIG. 11 illustrates a cross-sectional view of a component carrier according to an exemplary embodiment of the invention having a lined channel with cross shape.
Figure 12:
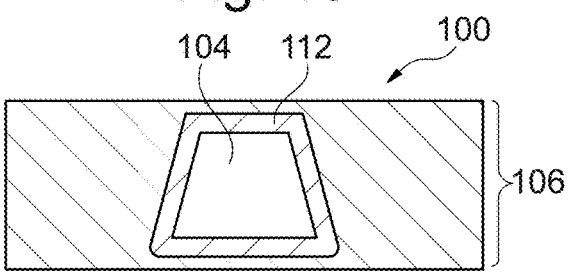
FIG. 12 illustrates a cross-sectional view of a component carrier according to an exemplary embodiment of the invention having a lined channel with trapezoid shape.
Figure 13:
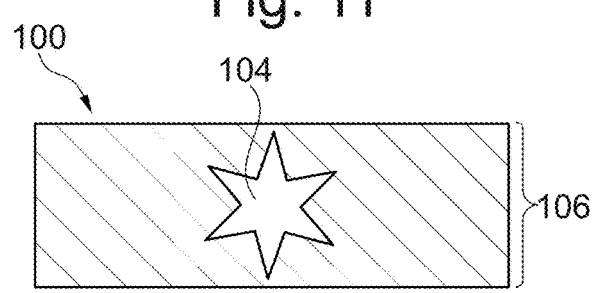
FIG. 13 illustrates a cross-sectional view of a component carrier according to an exemplary embodiment of the invention having a channel with star shape.
Figure 14:
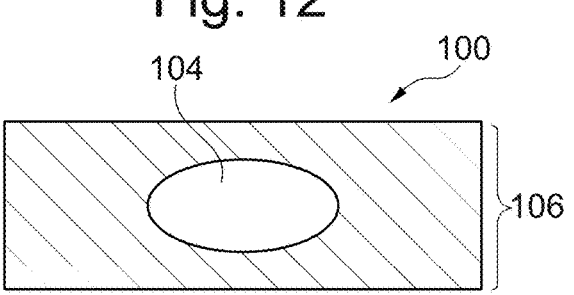
FIG. 14 illustrates a cross-sectional view of a component carrier according to an exemplary embodiment of the invention having a channel with oval shape.

FIG. 9 to FIG. 14 illustrate cross-sectional views of component carriers 100 with channels 104 formed by removing previously embedded filaments 102 according to exemplary embodiments of the invention. In the embodiment of FIG. 9, a copper-lined (see coating 112) channel 104 with plus-shape is shown. In the embodiment of FIG. 10, a copper-lined (see coating 112) channel 104 with arc-shape is shown. In the embodiment of FIG. 11, a copper-lined (see coating 112) channel 104 with cross-shape is shown. In the embodiment of FIG. 12, a copper-lined (see coating 112) channel 104 with trapezoid-shape is shown. In the embodiment of FIG. 13, a channel 104 with star-shape is shown. In the embodiment of FIG. 14, a channel 104 with oval shape is shown. Many other cross-sectional shapes (for instance a triangular shape) are possible, wherein the respective cross-sectional shape may be selected in accordance with a certain application or function of the component carrier 100. For instance, when the filament 102 forms an embedded heat pipe, a triangular cross-section may be advantageous so that evaporated medium may flow along one or more corners of the triangle.

Figure 15:
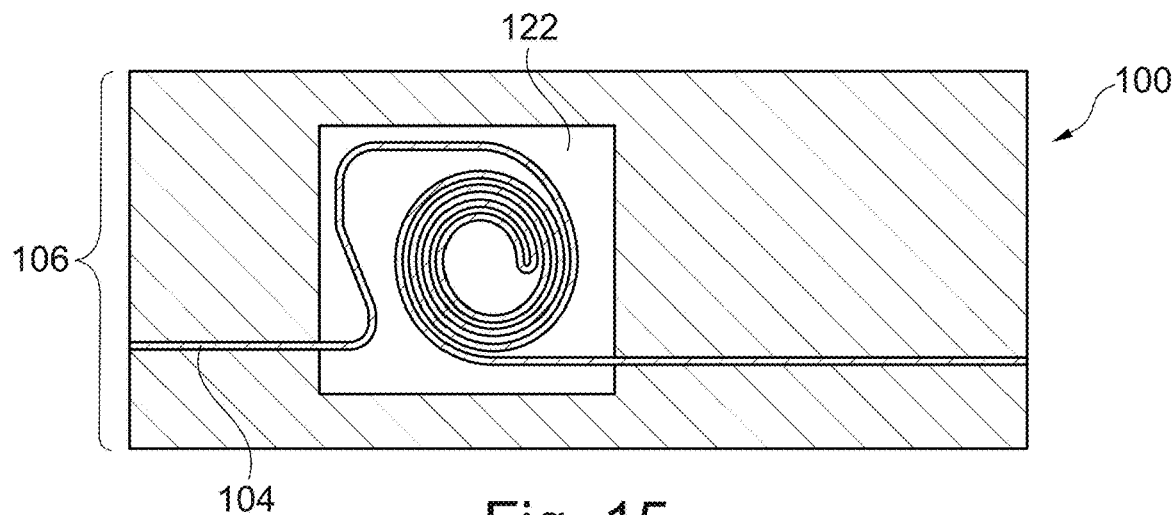
FIG. 15 and FIG. 16 illustrate cross-sectional views of component carriers according to exemplary embodiments of the invention with embedded components and a channel-based water cooling of such components.
Figure 16:
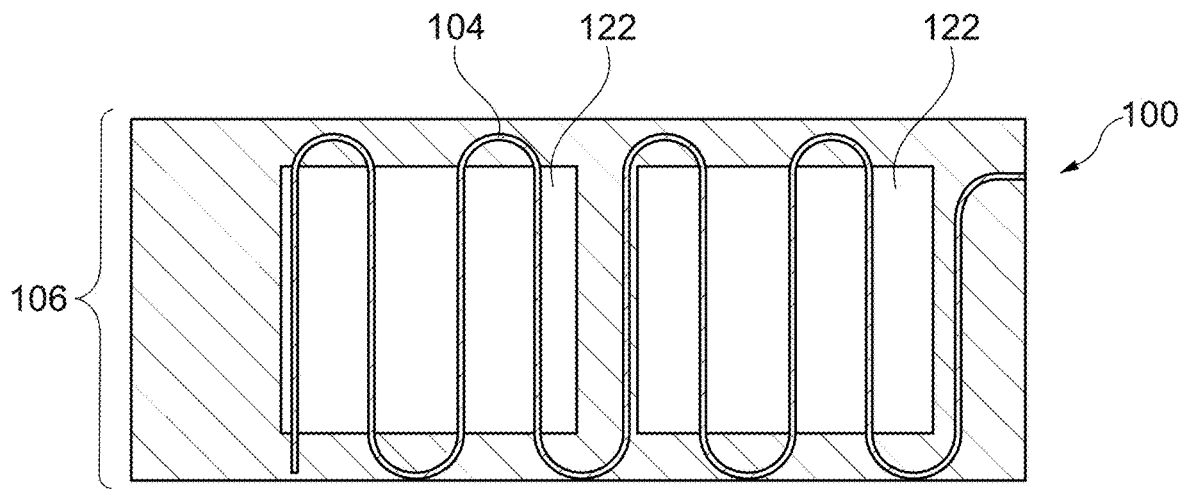

FIG. 15 and FIG. 16 illustrate cross-sectional views of component carriers 100 according to exemplary embodiments of the invention with embedded component(s) 122 and a channel 104 (formed by removing a previously embedded filament 102 from the component carrier 100) based water or air cooling of such components 122. A skilled person will understand that water or air cooling may be substituted by cooling using another cooling medium, for instance a liquid gas.

In the embodiment of FIG. 15, component 122 (for instance a semiconductor die such as a microprocessor) may be embedded in the stack 106 or placed on the surface of the build-up. According to FIG. 16, two components 122 (for instance two semiconductor dies such as a microprocessor and a memory) are embedded in the stack 106 or placed on the surface of the build-up. During operation of the respective component carrier 100, a substantial amount of heat may be generated by the component(s) 122. By the coiled (see FIG. 15) or meandrous (see FIG. 16) configuration of the channel 104 in the region of the respective components(s) 122, a cooling medium guided through the channel 106 may efficiently cooling the respective component(s) 122.

As an alternative to the configuration of FIG. 15 or FIG. 16, it is also possible to produce the filament 102 of a thermally highly conductive material (such as copper or aluminum) and to dimension the filament 102 sufficiently large so that the thermal coupling of the respective filament 102 with the component(s) 122 allows removing heat generated during operation of the component carrier 100 away from the component(s) 122. In such an embodiment, the filament 102 itself serves as heat removing structure for cooling the components 122.

Figure 17:
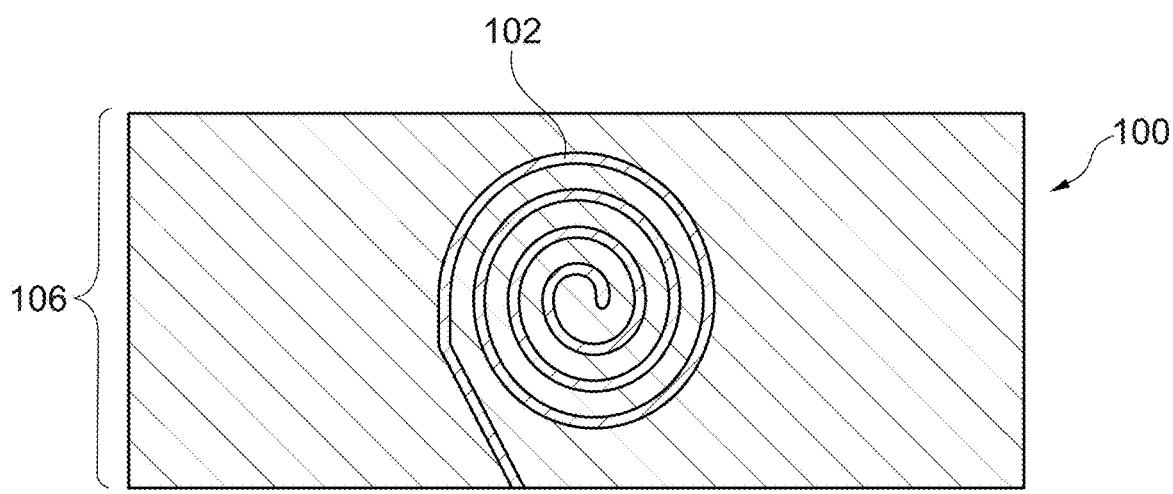
FIG. 17 illustrates a cross-sectional view of a component carrier with filament-based wiring structure forming an inductor for a wireless charging application according to an exemplary embodiment of the invention.

FIG. 17 illustrates a cross-sectional view of a component carrier 100 with filament-based wiring structure forming an inductor for a wireless charging application according to an exemplary embodiment of the invention.

In the embodiment of FIG. 17, the filament 102 may be made of an electrically conductive material such as copper. In view of the wound configuration of the filament 102 according to FIG. 17, the filament 102 fulfils an inductor function. Although not shown in FIG. 17, the coiled type inductor formed by the filament 102 may be accompanied with a magnetic core (for instance made of a ferrite), which can be embedded in the component carrier 100 as an embedded component 122. Alternatively, a filament-based antenna structure embedded in a component carrier 100 may be formed in a corresponding way as shown in FIG. 17.

As an alternative embodiment, it is also possible to remove a dummy filament 102 out of the component carrier 100 to thereby maintain a channel 104 with coiled shape. It may then be possible to subsequently fill such a channel 104 remaining in the stack 106 after removing the filament 102 with electrically conductive material to thereby form an inductor structure or an antenna structure.

Figure 18:
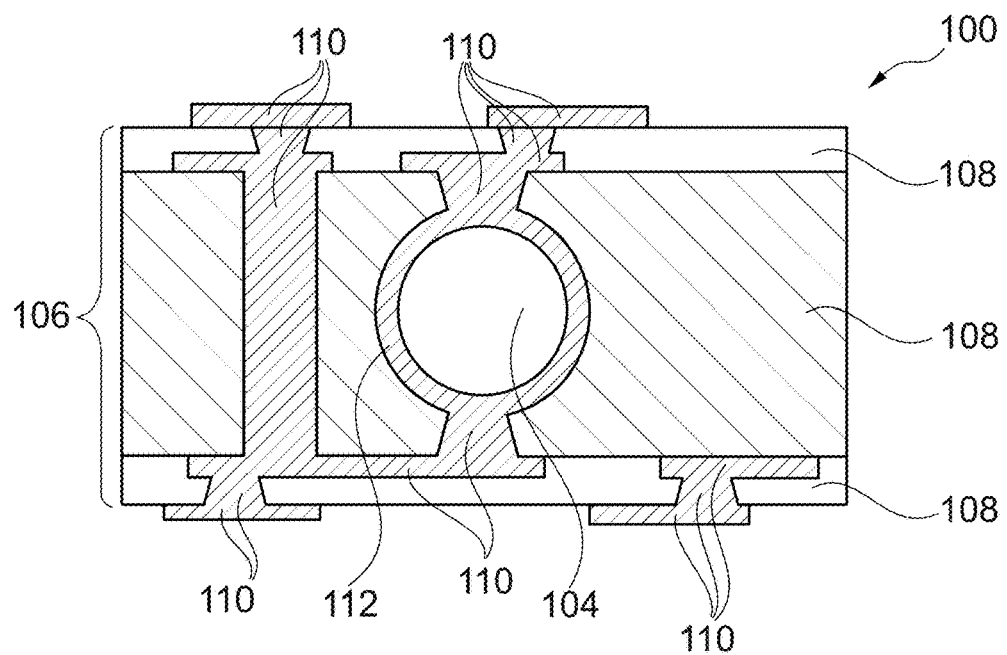
FIG. 18 illustrates a cross-sectional view of a component carrier with horizontally extending lined channel according to an exemplary embodiment of the invention.

FIG. 18 illustrates a cross-sectional view of a component carrier 100 with horizontal channel 104 according to an exemplary embodiment of the invention.

The (in particular hollow) channel 104 is coated with an electrically conductive coating 112, for instance made of copper. The channel 104 is formed by embedding a filament 102 in the component carrier 100 and subsequently removing the filament 102. As an alternative, the filament 102 may be also made of electrically conductive material (for instance made of copper) and may remain permanently inside and form part of the component carrier 100 (for instance to completely fill the channel 104 with copper material).

As can be taken from FIG. 18, the coating 112 (or alternatively the filament 102, not shown) may be connected to one or more electrically conductive layer structures 110 of the (for instance PCB-type) component carrier 100. FIG. 18 in particular shows, as electrically conductive layer structures 110, vertical interconnect structures (in particular copper filled mechanically drilled through holes and copper filled laser drilled through holes) and patterned copper foils. The electrically conductive layer structures 110 configured as (in particular laser and/or mechanically drilled) vias may function to electrically and/or thermally connect the PCB-type component carrier 100.

Figure 19:
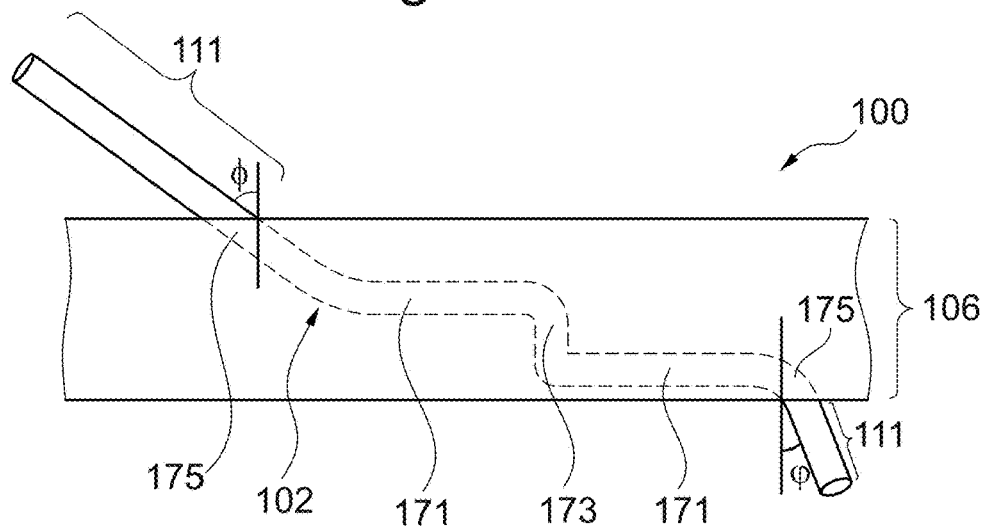
FIG. 19 illustrates a cross-sectional view of a component carrier with a filament having multiple section extending horizontally, vertically and slanted according to an exemplary embodiment of the invention, and being capable of forming a correspondingly shaped channel after removing the filament.

FIG. 19 illustrates a cross-sectional view of a component carrier 100 with a channel 104 having multiple section extending horizontally (see reference numeral 171), vertically (see reference numeral 173) and slanted (see reference numeral 175) according to an exemplary embodiment of the invention.

The structure according to FIG. 19 shows an embedded filament 102 in the stack 106 which is bent along a three-dimensional trajectory in the stack 106. Different sections of the filament 102 have different angles Φ, φ, etc. with regard to a vertical direction (in other words, Φ, φ may denote the respective cavity angle towards the surface normal). Referring to FIG. 19, the orientation of the filament 102 may be selected to reach one or more predefined constraints such as φ≠φ, 0≤φ≤n, etc. After having removed the filament 102 out of the component carrier 100, a three-dimensionally curved cavity or channel 104 maintains.

Figure 20:
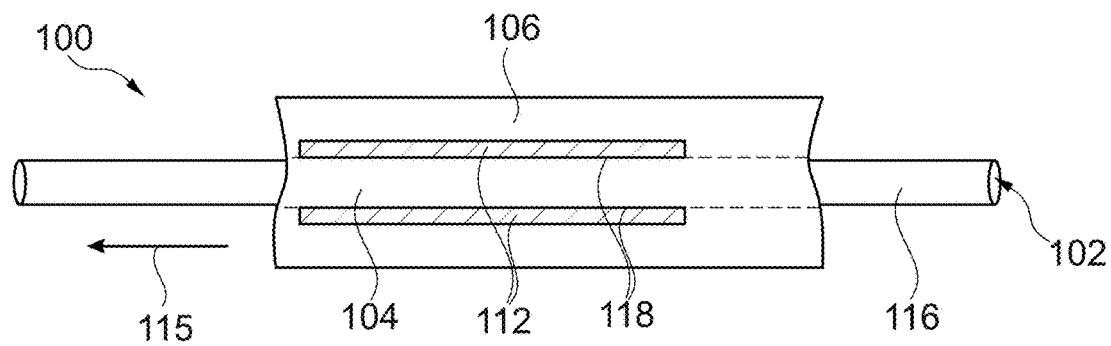
FIG. 20 illustrates a cross-sectional view of a component carrier with a shielded channel according to an exemplary embodiment of the invention.

FIG. 20 illustrates a cross-sectional view (parallel to an extension direction of a filament 102) of a component carrier 100 with a shielded channel 104 according to an exemplary embodiment of the invention. FIG. 21 illustrates a cross-sectional view of a filament 102 (wherein an extension direction of the filament 102 is perpendicular to the paper plane of FIG. 21) according to an exemplary embodiment of the invention, which can be used advantageously for the embodiment of FIG. 20.

FIG. 20 shows an embodiment in which a longitudinally central portion of the filament 102 has a coating 112 of copper. Between a core 116 and the coating 112 of the filament 102, a release layer 118 is sandwiched which is non-adhesive. Thus, the core 116 of the filament 102 is covered with the release layer 118 being covered, in turn, by the copper coating 112. As a result, when removing the core 116 with the release layer 118 out of the stack 106 by pulling along pulling direction 115, the coating 112 maintains inside of the stack 106 for lining the remaining channel 104 in the stack 106. By such a procedure, a shielded cavity may be formed by channel 104 surrounded by the copper coating 112.

Figure 22:
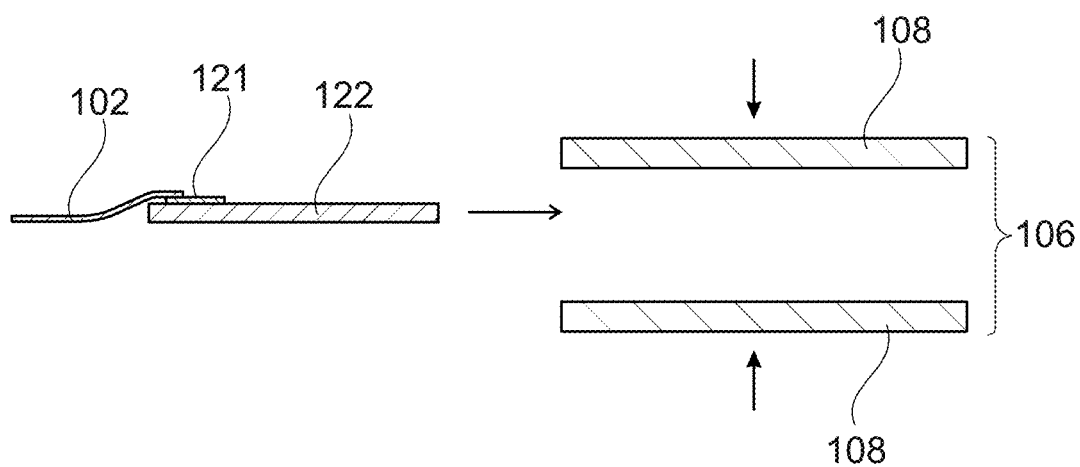
FIG. 22 illustrates a cross-sectional view of an electrically conductive filament electrically and mechanically connected to a pad of a component according to an exemplary embodiment of the invention, wherein the component and the filament are preassembled before embedding them in a stack of the component carrier.

FIG. 22 illustrates a cross-sectional view of an electrically conductive filament 102 electrically and mechanically connected to one or more pads 121 of a component 122 according to an exemplary embodiment of the invention. As shown, the component 122 and the filament 102 are pre-assembled before embedding them in a stack 106 of the component carrier 100.

According to FIG. 22, the electrically conductive filament 102 is electrically coupled with one or more pads 121 of the component 122 so as to transfer electric signals and/or electric energy between the component 122 and an exterior of the component carrier 100. When the component 122 with already electrically connected filament 102 is embedded in the stack 106 (without previous cavity formation according to FIG. 22 or with previous cavity formation, see recess 114 in FIG. 1), a complicated subsequent electric contacting of the component 122 may be omitted.

It should be noted that the term "comprising" does not exclude other elements or steps and the article "a" or "an" does not exclude a plurality. Also, elements described in association with different embodiments may be combined.

Implementation of the component carrier is not limited to the preferred embodiments shown in the figures and described above. Instead, a multiplicity of variants are possible which use the solutions shown and the principle according to the disclosed component carrier even in the case of fundamentally different embodiments.

The invention claimed is:

1. A method of manufacturing a component carrier, comprising:
    forming a stack comprising at least one electrically insulating layer structure and/or at least one electrically conductive layer structure;
    embedding a filament in the stack; and
    removing the embedded filament partially or entirely out of the stack by pulling the filament out of the stack.

2. The method according to claim 1, comprising at least one of the following features:
    wherein the method comprises embedding the filament in the stack so as to form an in-plane trajectory within a plane perpendicular to a stacking direction of the layer structures of the stack;

wherein the method comprises embedding the filament in the stack so that the filament is arranged along a three-dimensional-out of plane trajectory having at least one section within a stacking plane of the layer structures of the stack and at least one other section perpendicular to the stacking plane of the layer structures of the stack.

3. The method according to claim 1, comprising at least one of the following features:
wherein the method comprises covering at least part of an interior wall of the stack, delimited by a channel remaining after removing the filament, by a coating;
wherein the method comprises at least partially filling a channel, which remains in the stack after removing the filament, with electrically conductive material to form an antenna structure;
wherein the method comprises at least partially filling a channel, which remains in the stack after removing the filament, with thermally conductive material to form a heat removal structure for removing heat generated during operation of the component carrier;
wherein the method comprises guiding a cooling fluid through a channel, which remains in the stack after removing the filament, for removing heat generated during operation of the component carrier;
wherein the method comprises configuring a channel, which remains in the stack after removing the filament, for guiding one of acoustic waves, electromagnetic high-frequency waves, and visible electromagnetic waves along the channel;
wherein the method comprises promoting removability of the filament out of the stack by at least one of a group consisting of ultrasonic vibrations, and temperature increase.

4. The method according to claim 1, wherein the method comprises configuring a surface of the filament in contact with the stack to be non-adhesive with regard to the material of the stack.

5. The method according to claim 1, wherein the method comprises:
forming at least one recess in at least one of the layer structures of the stack;
placing the filament in the recess; and
connecting the layer structures to thereby embed the filament in the stack.

6. The method according to claim 1, wherein the method comprises:
embedding the filament between opposing planar surfaces of two layer structures of the stack without forming a recess in any of these two layer structures.

7. The method according to claim 1, wherein the method comprises:
wherein the filament comprises a core covered with a release layer being covered, in turn, by a coating; and
removing the core out of the stack while keeping the coating inside of the stack for lining a remaining channel in the stack with the coating.

8. A method of manufacturing a component carrier, comprising:
forming a stack comprising at least one electrically insulating layer structure and/or at least one electrically conductive layer structure;
embedding a filament in the stack; and
configuring a surface of the filament in contact with the stack to be non-adhesive with regard to the material of the stack.

9. A method of manufacturing a component carrier, comprising:
forming a stack comprising at least one electrically insulating layer structure and/or at least one electrically conductive layer structure;
embedding a filament in the stack;
removing the embedded filament partially or entirely out of the stack; and
guiding a cooling fluid through a channel, which remains in the stack after removing the filament, for removing heat generated during operation of the component carrier.

10. A method of manufacturing a component carrier, comprising:
forming a stack comprising at least one electrically insulating layer structure and/or at least one electrically conductive layer structure;
embedding a filament in the stack, which filament comprises a core covered with a release layer being covered, in turn, by a coating; and
removing the core out of the stack while keeping the coating inside of the stack for lining a remaining channel in the stack with the coating.

11. A method of manufacturing a component carrier, comprising:
forming a stack comprising at least one electrically insulating layer structure and/or at least one electrically conductive layer structure;
embedding a filament in the stack by
forming at least one recess in at least one of the layer structures of the stack,
placing the filament in the recess, and
connecting the layer structures to thereby embed the filament in the stack; and
removing the embedded filament partially or entirely out of the stack.

* * * * *